(12) United States Patent
Fernandez (10) Patent No.: US 7,616,065 B2
(45) Date of Patent: Nov. 10, 2009

(54) SYSTEM AND METHOD FOR CHARGE-PUMP WITH PHASE-FREQUENCY DETECTION CAPABILITY

(75) Inventor: Francisco Fernandez, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 71 days.

(21) Appl. No.: 11/424,332

(22) Filed: Jun. 15, 2006

(65) Prior Publication Data

US 2007/0146081 A1    Jun. 28, 2007

Related U.S. Application Data

(63) Continuation-in-part of application No. 11/321,386, filed on Dec. 28, 2005, now Pat. No. 7,315,218.

(51) Int. Cl.
*H03L 7/085* (2006.01)
*G01R 25/00* (2006.01)

(52) U.S. Cl. .................. 331/16; 331/25; 327/7; 327/12; 327/157

(58) Field of Classification Search .......... 331/16, 331/17, 25; 327/2–12, 156, 157; 375/374–376
See application file for complete search history.

(56) References Cited

U.S. PATENT DOCUMENTS 4,527,277 A * 7/1985 Kosaka et al. ............... 375/328
6,218,868 B1 * 4/2001 Katoh ........................ 327/12
7,005,896 B2 * 2/2006 Chen et al. .................. 327/112
7,057,418 B1 * 6/2006 Fu et al. ...................... 327/3

* cited by examiner

*Primary Examiner*—Robert Pascal
*Assistant Examiner*—Levi Gannon
(74) *Attorney, Agent, or Firm*—Martine Penilla & Gencarella, LLP (57) ABSTRACT

A method of generating a correction signal for a voltage controlled oscillator (VCO) includes receiving a first signal in a correction current generator, changing a state of a first error signal substantially simultaneously with a first changing state of the first signal, receiving a second signal in the correction current generator, changing a state of a second error signal substantially simultaneously with a first changing state of the second signal, changing the state of the first error signal substantially simultaneously with a second changing state of the second signal, changing the state of the second error signal substantially simultaneously with a second changing state of the first signal, combining the first error signal and the second error signal to generate the correction signal substantially equal to a difference between the first error signal and the second error signal and applying the correction signal to a loop filter coupled to a correction signal input of the VCO. A PLL circuit is also described.

14 Claims, 11 Drawing Sheets

SYSTEM AND METHOD FOR CHARGE-PUMP WITH PHASE-FREQUENCY DETECTION CAPABILITY

CROSS REFERENCE TO RELATED APPLICATIONS

This application is a continuation-in-part of and claims priority from U.S. patent application Ser. No. 11/321,386, now U.S. Pat. No. 7,315,218, filed on Dec. 28, 2005 and entitled "Method and Apparatus to Center the Frequency of a Voltage-Controlled Oscillator," which is incorporated herein by reference in its entirety.

BACKGROUND

The present invention relates generally to phase-locked loop (PLL) circuits, and more particularly, to methods and systems for generating a correction current in a PLL circuit.

Figure 1:
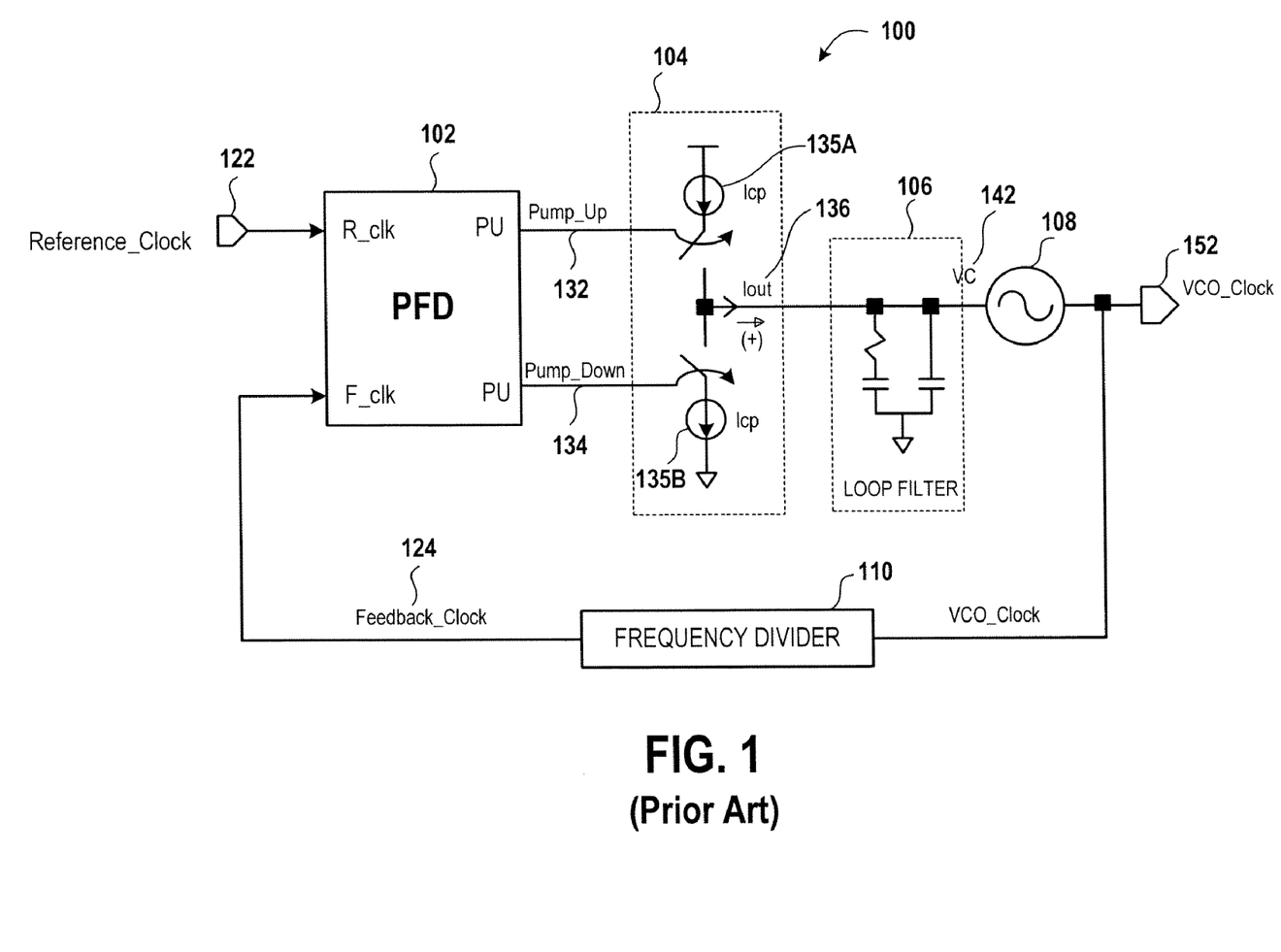
FIG. 1 is a schematic diagram of a typical PLL circuit used in frequency synthesis.

Phase-frequency detectors (PFDs) are commonly used in phase-locked loop (PLL) circuits. PLL's are often used as part of input/output (I/O) portions microprocessors and in clock signal generating circuits. FIG. 1 is a schematic diagram of a typical PLL circuit 100 used in frequency synthesis. The PLL includes a phase-frequency detector (PFD) 102, a charge-pump 104, a loop filter 106, a voltage-controlled oscillator (VCO) 108 and a frequency divider 110. The function of each of these components is described as follows.

The PFD 102 detects a phase difference between the edges of a reference clock 122 and a second signal (e.g., a feedback clock) 124. The phase difference can be caused by a phase skew between signals of the same frequency or, a difference in frequency between the signals or a combination of both effects. The PFD 102 produces two output signals: a pump-up signal 132 and a pump-down signal 134. The width of the pump-up signal 132 and pump-down signal 134 is proportional to a detected phase difference between the reference clock 122 and the feedback clock 124. A PFD 102 can also be used in any other circuit where the phases of two signals are compared to produce one or more output signals proportional to the phase difference of the input signals.

The charge-pump 104 responds to the pump-up signal 132 and pump-down signal 134 output by the PFD 102 to deliver a net amount of charge to the loop filter 106 proportional to the phase difference between the reference clock 122 and the feedback clock 124. The pump-up signal 132 causes the charge pump 104 to source more current to the loop filter 106. The pump-down signal 134 causes the charge pump 104 to sink current from the loop filter 106. Charge-pump circuits 104 are typically used in PLL, delay-locked loop (DLL) and clock-and-data recovery (DRC) circuits among others. The PLL circuit 100 performs various task such as clock synthesis, frequency multiplication, clock deskewing, time-jitter filtering, clock-and-data recovery, etc. By way of example, the typical PLL circuit 100 can be used as part of a SERDES or other I/O's of a microprocessors as the interface between core and the external world.

The loop filter 106 converts the current 136 delivered by the charge-pump 104 into a loop filter voltage 142. The loop filter voltage 142 is then applied to the VCO 108 to adjust or tune the frequency of the VCO clock output signal 152. The VCO 108 varies its frequency of oscillation in response to the loop filter voltage 142. The VCO 108 typically uses a transfer function in Hertz/Volt to produce a VCO clock output signal 152 with a frequency corresponding to the loop filter voltage 142.

The frequency divider 110 divides the frequency of VCO clock output signal 152 by a selected division ratio (N). The resulting frequency of the signal 124 output by the frequency divider 110 is 1/N of the frequency of the VCO output signal 152. If the PLL 100 is locked on a selected frequency of the VCO clock output signal 152, the frequency of feedback clock 124 is equal to that of the reference clock 122. The phase of the feedback clock 124 is also coincidental with the phase of the reference clock 122. It can also be said that the PLL 100 multiplies the frequency of the reference clock 122 by a factor of N.

The typical PLL circuit 100 is unnecessarily complex and inefficient. As a result the performance is limited. Specifically the PFD 102 and charge pump 104 can be significantly simplified to more efficiently generate a correction current for the VCO 108.

SUMMARY

Broadly speaking, the present invention fills these needs by providing methods and systems for generating a correction current in a PLL circuit. It should be appreciated that the present invention can be implemented in numerous ways, including as a process, an apparatus, a system, computer readable media, or a device. Several inventive embodiments of the present invention are described below.

One embodiment provides a method of generating a correction signal for a voltage controlled oscillator (VCO) includes receiving a first signal in a correction current generator, changing a state of a first error signal substantially simultaneously with a first changing state of the first signal, receiving a second signal in the correction current generator, changing a state of a second error signal substantially simultaneously with a first changing state of the second signal, changing the state of the first error signal substantially simultaneously with a second changing state of the second signal, changing the state of the second error signal substantially simultaneously with a second changing state of the first signal, combining the first error signal and the second error signal to generate the correction signal substantially equal to a difference between the first error signal and the second error signal and applying the correction signal to a loop filter coupled to a correction signal input of the VCO.

The first signal can be a reference signal and the second signal can be a feedback signal output from the VCO. Alternatively, the second signal can be a reference signal and the first signal can be a feedback signal output from the VCO.

The first signal can lead the second signal. The first signal and the second signal can have a substantially 50% duty cycle. The method can also include converting the first signal and the second signal to have the substantially 50% duty cycle.

The correction current generator can include multiple current paths. Changing the state of the first error signal can include selecting a corresponding one of the current paths in the correction current generator. Changing the state of the second error signal can include selecting a corresponding one of the current paths in the correction current generator.

Another embodiment provides a phase locked loop circuit including a selector circuit and a correction current generator. The selector circuit includes a reference clock input, a feedback clock input and multiple select output signals. The select output signals include a buffered reference clock, a buffered feedback clock, an inverted reference clock, an inverted feedback clock, a buffered select signal equal an inverse of a product of the buffered reference clock and the buffered feedback clock; and an inverted select signal equal to a product of the buffered reference clock and the buffered feedback clock. The correction current generator includes multiple inputs coupled to the select outputs and a correction current output.

The PLL circuit can also include a loop filter including an input coupled to the correction current output of the correction current generator and a loop filter voltage output. The PLL circuit can also include a voltage-controlled oscillator including a frequency control input coupled to the loop filter voltage output and a VCO clock output. The PLL circuit can also include a frequency divider having an input coupled to the VCO clock output and an output coupled to the reference clock input of the selector circuit.

The correction current output can be a single correction current output. The correction current output can include a single correction current output including a common mode rejection. The single correction current output including the common mode rejection can include a pair of differential correction current outputs that are combined to form the single correction current output with the common mode rejection. The correction current generator can include multiple current paths, and wherein the current paths are selectively enabled by a corresponding one of the select signals.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for methods and systems for generating a correction current in a PLL circuit will now be described. It will be apparent to those skilled in the art that the present invention may be practiced without some or all of the specific details set forth herein.

Figure 2:
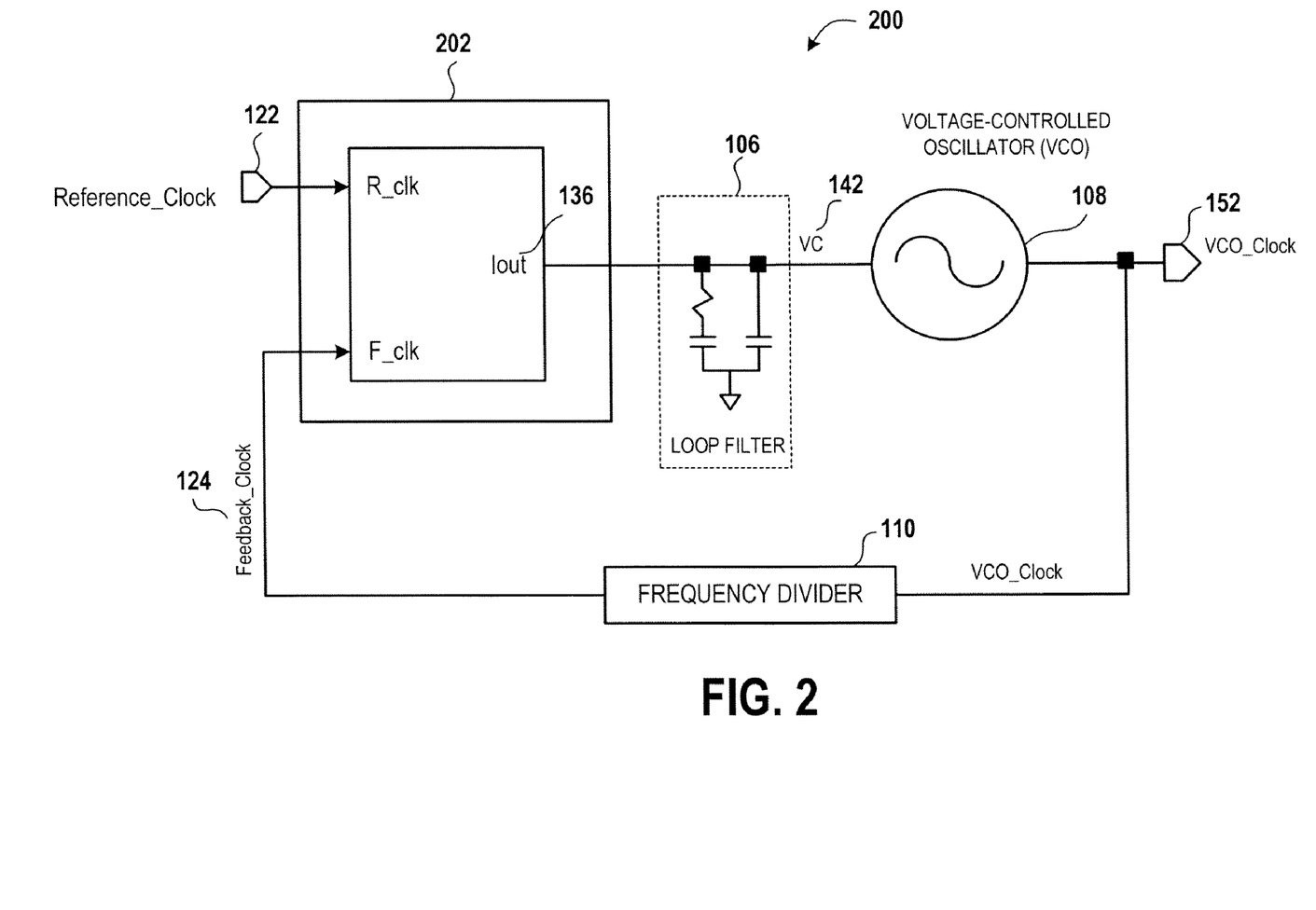
FIG. 2 is a schematic diagram of a PLL circuit, in accordance with an embodiment of the present invention.

FIG. 2 is a schematic diagram of a PLL circuit 200, in accordance with an embodiment of the present invention. The PLL circuit 200 includes correction current generator 202 that can detect a phase-frequency difference and also generate a corresponding correction current for the loop filter 106. The PLL circuit 200 does not need a PFD 102 and therefore the PLL circuit 200 is simpler and smaller and consumes less power. The simpler PLL circuit 200 also has an increased reliability than a typical PLL circuit 100 due to having fewer components and less circuitry that can fail. Yet another benefit is reduced phase noise clock generation.

Eliminating the need of a PFD 102 results in a more compact PLL circuit 200 layout that consumes less power and has higher reliability since it contains fewer devices (e.g., transistors, CMOS devices, etc.) than the typical PLL 100 including a PFD 102 and a charge pump 104.

The PLL circuit 200 generates a VCO clock 152 with reduced phase noise as compared to the typical PLL circuit 100 because the correction current generator 202 pumps current into or draws current from the loop filter at both rising and falling edges of reference clock 122. As a result, the loop filter 106 is "refreshed" at twice the rate or more often than with a traditional PLL circuit 100 structure. The effective update frequency is then twice and given the low-pass-filter action of the PLL and for a given bandwidth the undesired noise injection introduced at the pumping frequency will be better filtered since it would lie at a frequency much higher than the 3-dB frequency of the typical PLL circuit 100 than the pumping frequency of a traditional charge pump 104.

Another benefit to dual edge operation or double-frequency updates is that for the same effective charge per reference clock period, the bias or stand-by current of the correction current generator 202 could be reduced by about one half. This further reduces the area, power consumption and electronic noise injected into the loop filter 106 because the noise is typically proportional to the biasing current.

In operation, the correction current generator 202 includes two input nodes with the reference clock 122 and the feedback clock 124 applied respectively. The correction current generator 202 also includes a bi-directional current node Iout where the correction current 136 is applied. The correction current 136 can be a current source or a current sink current through the Iout node.

Constant correction current 136 is sourced at the Iout node during the time the rising edge of the reference clock 122 leads the rising edge of feedback clock 124. This is referred to as pump-up since it will increase the frequency of the VCO 108.

Constant correction current 136 will be sunk at the Iout node during the time the rising edge of the reference clock 122 lags the rising edge of the feedback clock 124. This is referred to as pump-down since it will reduce the frequency of the VCO.

Figure 3A:
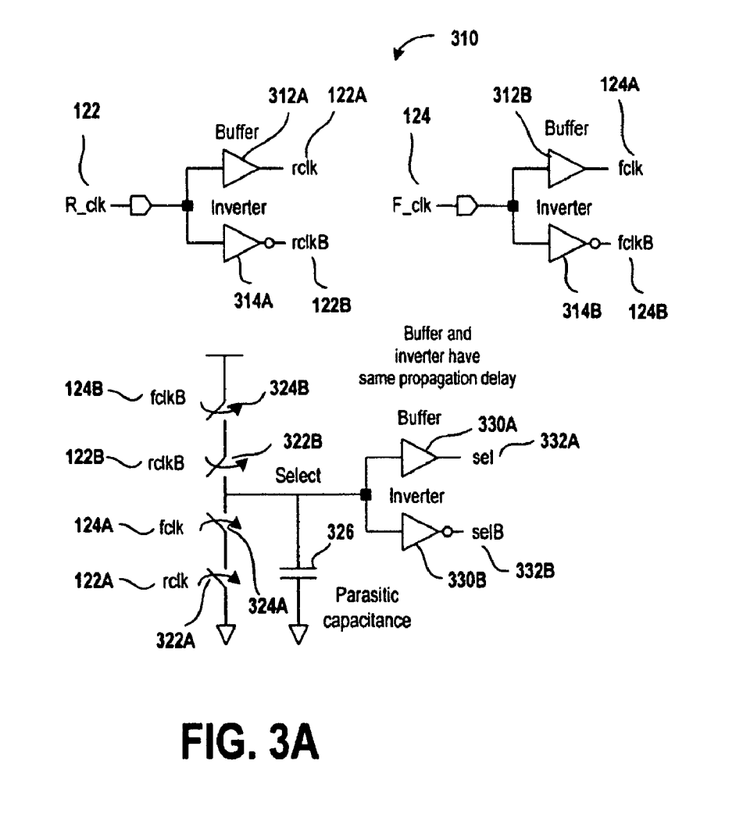
FIG. 3A is a schematic diagram of a select circuit that is included in each of the different correction current generators, in accordance with various embodiments of the present invention.
Figure 3B:
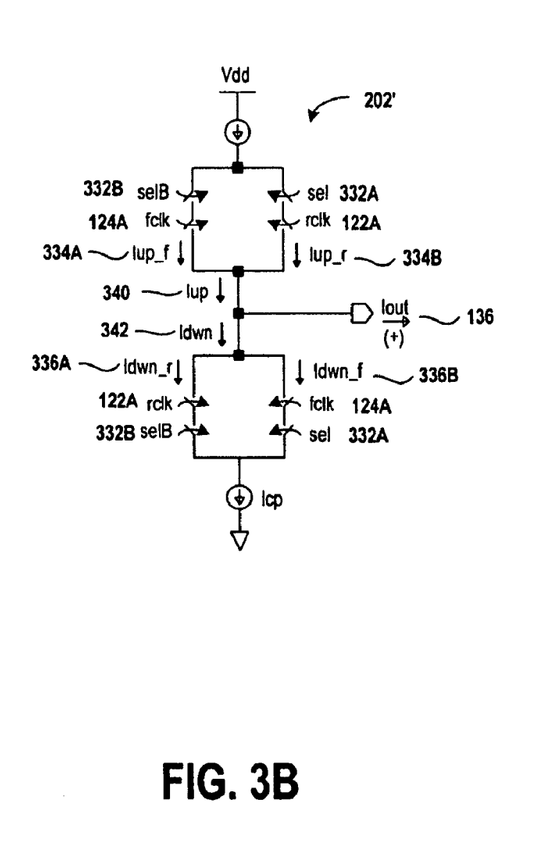
FIGS. 3B-D are schematic diagrams of different correction current generators, in accordance with various embodiments of the present invention.
Figure 3C:
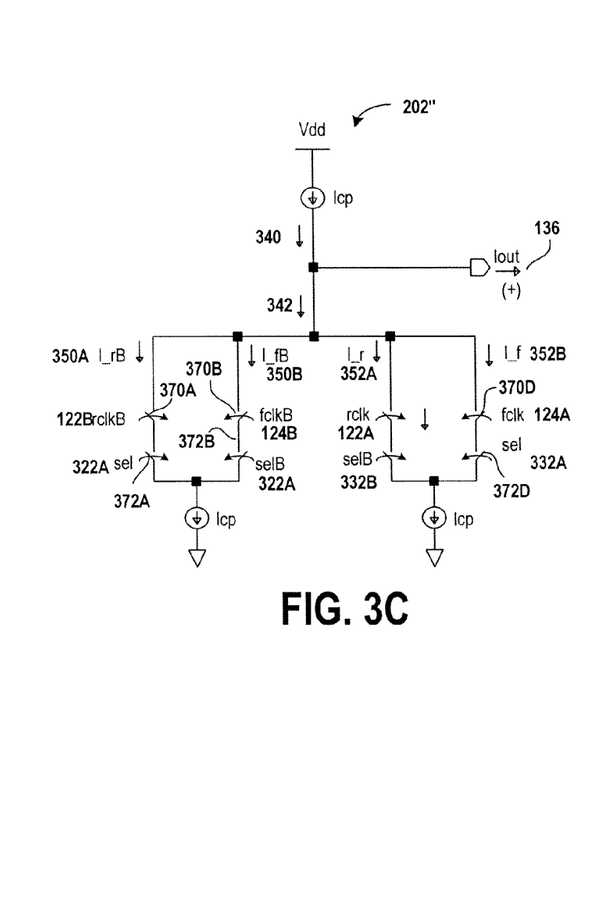
Figure 3D:
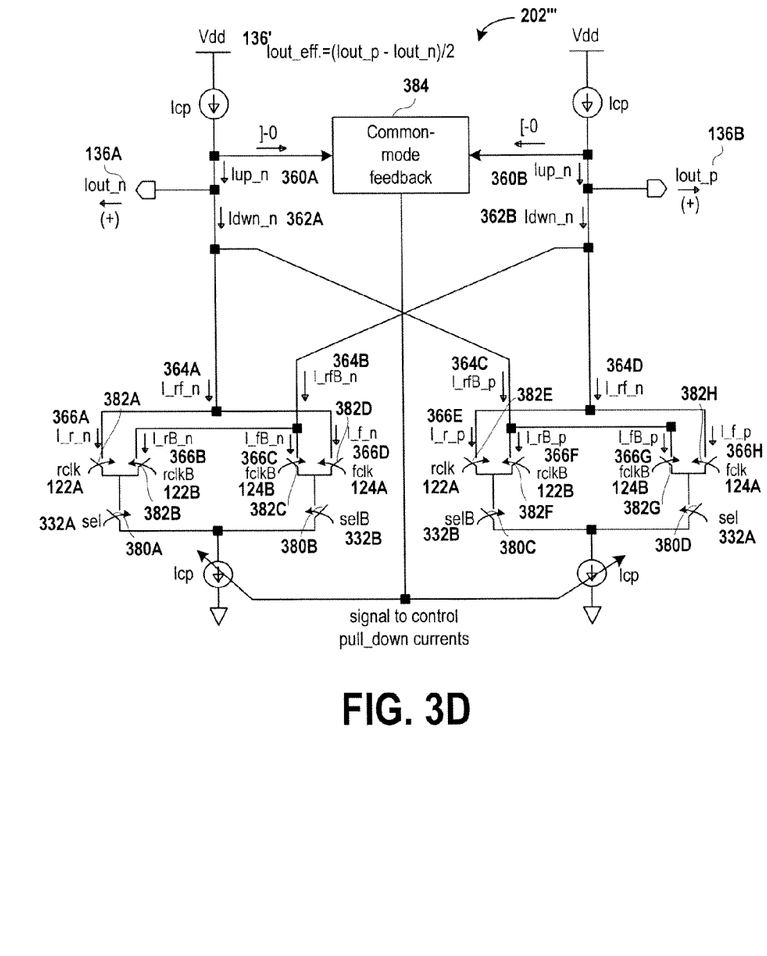

FIGS. 3B-D are schematic diagrams of different correction current generators 202', 202" and 202''', in accordance with various embodiments of the present invention. The schematic diagrams of different correction current generators 202', 202" and 202''' are illustrated as being based upon switches, however it should be understood that any type of device (e.g., transistor, CMOS, etc. and combinations thereof) could be used in place of the switches. Two single-ended and one differential.

FIG. 3A is a schematic diagram of a select circuit 310 that is included in each of the different correction current generators 202', 202" and 202''', in accordance with various embodiments of the present invention. In operation, the buffers 312A and 312B buffer the respective reference clock 122 and the respective feedback clock 124 to produce the buffered reference clock 122A and the buffered feedback clock 124A. The inverters 314A and 314B invert the respective reference clock 122 and the respective feedback clock 124 to produce the reference clock_not 122B and the feedback clock_not 124B. The resulting signals 122A-124B are applied to respective switching devices 322A-324B. The select signal output 332A will only be low when both inputs are high. The select signal output 332A will only be high when both inputs are low. Conversely, the select_not signal output 332B will only be high when both inputs are high. The select_not signal output 332B will only be low when both inputs are low. The six signals 122A-124B, 332A and 332B produced by the select circuit 310 are used to produce the correction current in the correction current generators 202', 202" and 202'''.

Referring now to FIG. 3B, the correction current generator 202' includes two paths 334A and 334B from Vdd to Iout 136 and two paths 336A and 336B from ground to Iout 136. When select 332A is high the left-side paths 334A and 336A are disabled and the correction current generator 202' operates as follows:

| If select 332A = 1, then | | |
|---|---|---|
| rclk | fclk | Iout |
| 0 | 0 | 0 |
| 0 | 1 | pump DOWN (sinking current at Iout) |
| 1 | 0 | pump UP (sourcing current at Iout) |
| 1 | 1 | 0 |

When select 332A is low then the right-side paths 334B and 336B are disabled and the correction current generator 202' operates as follows:

| If select 332A = 0 | | |
|---|---|---|
| rclk | fclk | Iout |
| 0 | 0 | 0 |
| 0 | 1 | pump UP |
| 1 | 0 | pump DOWN |
| 1 | 1 | 0 |

Note that there is a reversal in the action when select 332A=0 with respect to when it is 1. FIGS. 3C and 3D are somewhat more complex but operate substantially similarly.

Referring now to FIG. 3C, the correction current generator 202" includes switching devices 370A-D and 372A-D arranged in four paths 350A, 350B, 352A and 352B. Each of the four paths 350A, 350B, 352A and 352B includes a pair of the respective switching devices 370A-D and 372A-D that are connected in series. The correction current generator 202" includes a single path 340 from Vdd to Iout 136 and the four paths 350A, 350B, 352A and 352B from ground to Iout 136. When select 332A is high the paths 350A and 352B are enabled and paths 350B and 352A are disabled. When select 332A is low the paths 350B and 352A are enabled and paths 350A and 352B are disabled.

Referring now to FIG. 3D, the correction current generator 202''' is a differential correction current generator as the net or effective correction current 136' can include a rejection of any common mode errors. The correction current generator 202''' includes switching devices 380A-D and 382A-H arranged in eight paths 366A-H. Each of the eight paths 366A-H includes a pair of the respective switching devices 380A-D and 382A-H that are connected in series. Each of the eight paths 366A-H can be selectively enabled or disabled by the select signal 332A and the select_not signal 332B.

The correction current generator 202''' includes a single path 360A from Vdd to Iout_n 136A and a single path 360B from Vdd to Iout_p 136B. The correction current generator 202''' also includes the four paths 366A, 366D, 366F and 366G from ground to Iout_n 136A. The correction current generator 202''' also includes the four paths 366B, 366C, 366E and 366H from ground to Iout_p 136B. When select 332A is high the paths 366A, 366B, 366G and 366H are enabled and paths 366C-F are disabled. When select 332A is low the paths 366C-F are enabled and paths 366A, 366B, 366G and 366H are disabled.

The correction current generator 202' provides no current flow between Vdd and ground when reference clock 122=feedback clock 124=0. The correction current generators 202" and 202''' provides a path between Vdd and ground when even when reference clock 122=feedback clock 124=0. The correction current generators 202' and 202" are single-ended topologies providing a single correction current 136. In comparison, the correction current generator 202''' provides a differential topology to produce a differential correction current outputs 136A and 136B to drive a differential loop filter. The differential correction current outputs 136A and 136B can also be combined to form a single correction current 136'. The single correction current 136' rejects any common mode errors through a common mode feedback circuit 384.

Figure 5A:
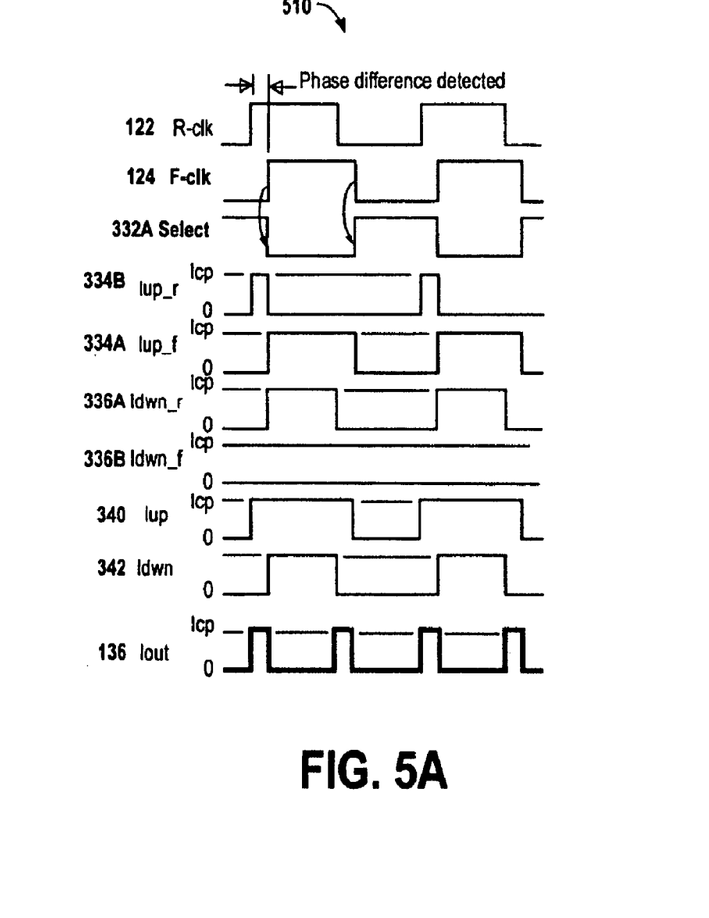
FIGS. 5A, 5B and 6 provide graphical representations of the waveforms of the operations of the correction current generator of FIG. 3B, in accordance with an embodiment of the present invention.
Figure 5B:
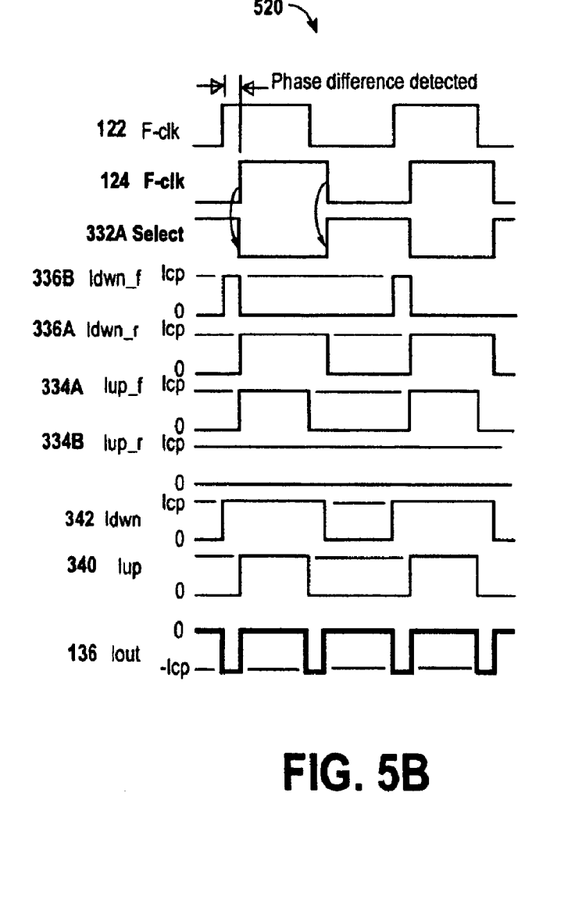
Figure 6:
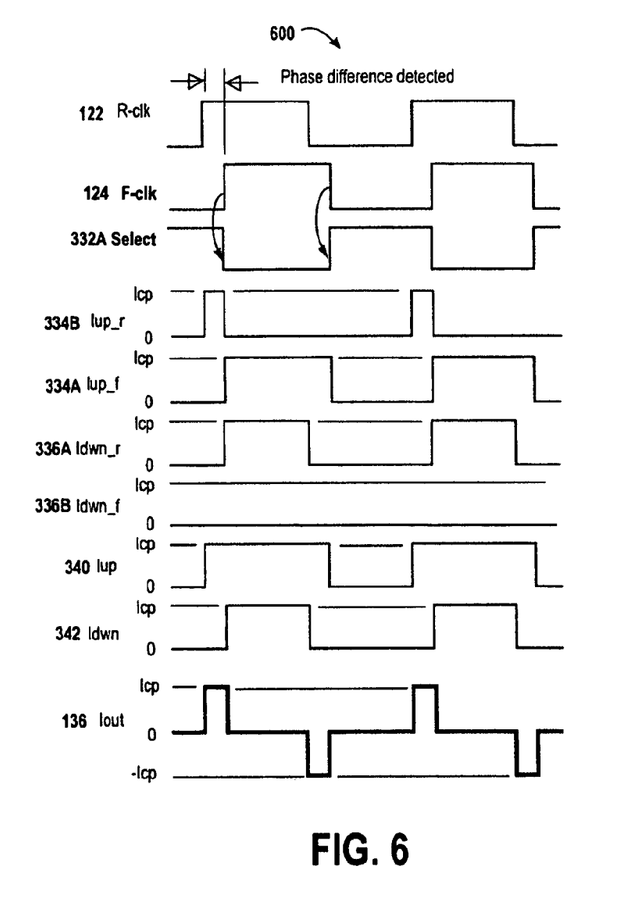
Figure 7:
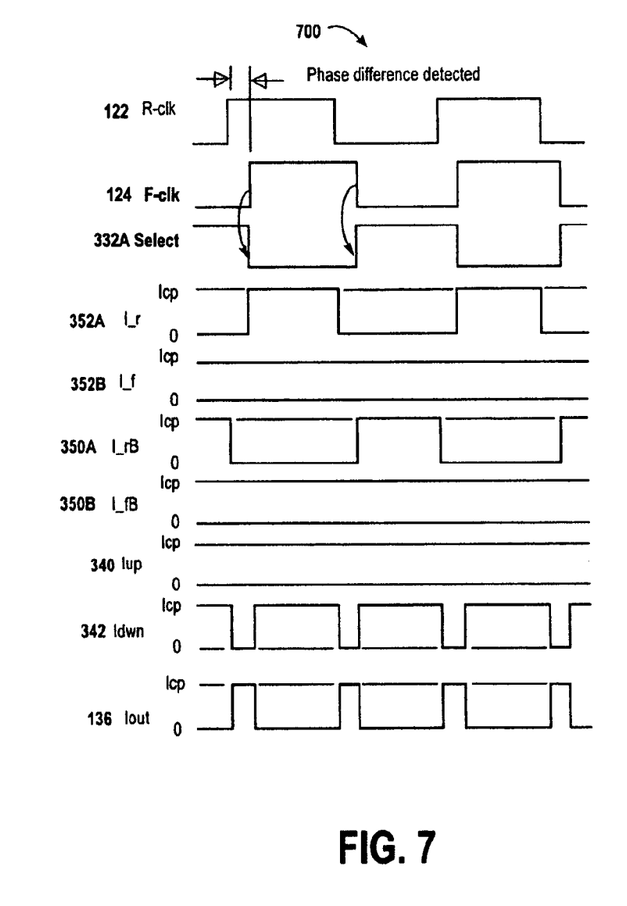
FIG. 7 provides a graphical representation of the waveforms of the operations of the correction current generator of FIG. 3C, in accordance with an embodiment of the present invention.
Figure 8:
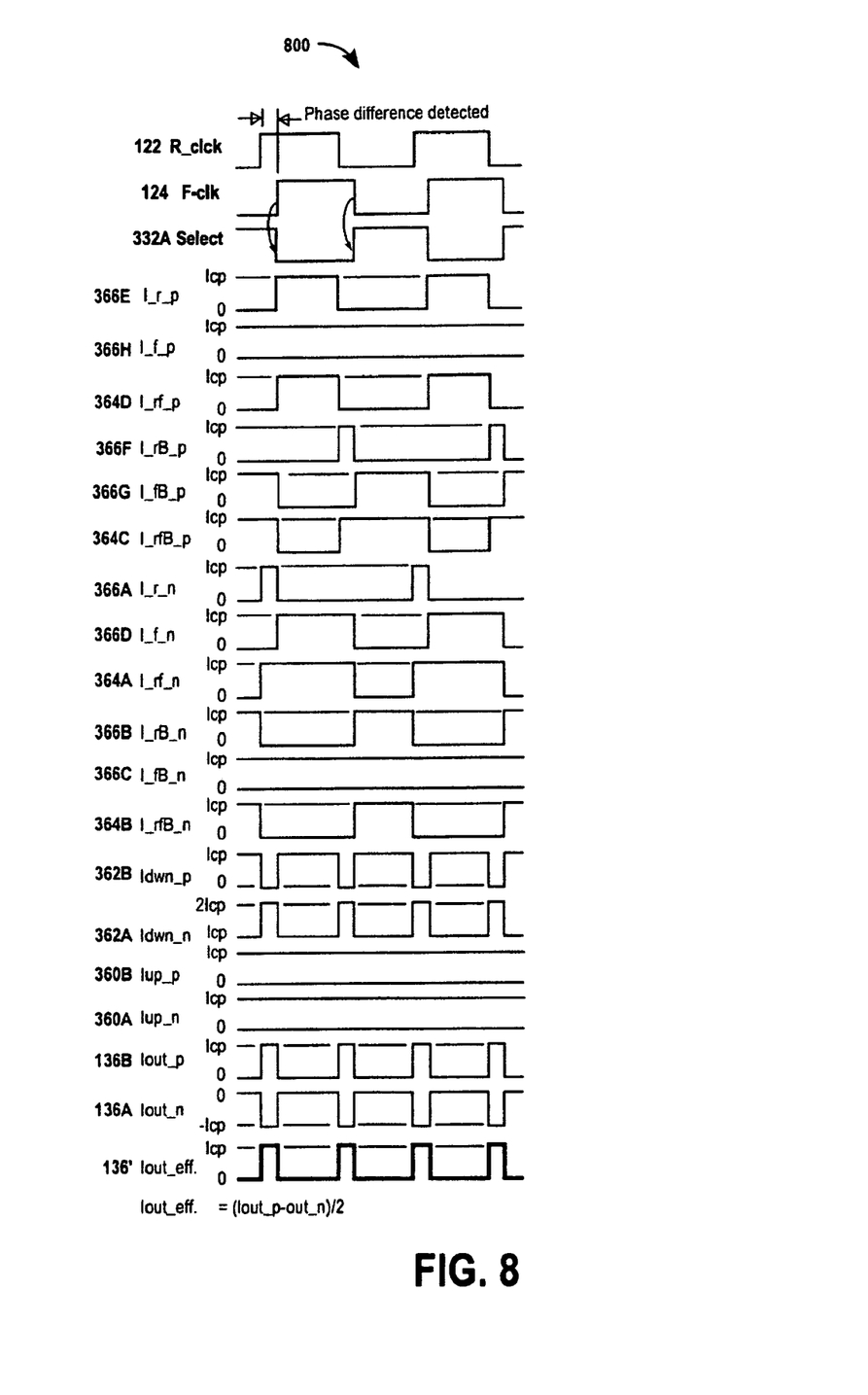
FIG. 8 provides a graphical representation of the waveforms of the operations of the correction current generator of FIG. 3D, in accordance with an embodiment of the present invention.

FIGS. 5A, 5B and 6 provide graphical representations of the waveforms 510, 520 and 600 of the operations of the correction current generator 202' of FIG. 3B, in accordance with an embodiment of the present invention. FIG. 7 provides a graphical representation of the waveforms 700 of the operations of the correction current generator 202" of FIG. 3C, in accordance with an embodiment of the present invention. FIG. 8 provides a graphical representation of the waveforms 800 of the operations of the correction current generator 202''' of FIG. 3D, in accordance with an embodiment of the present invention.

FIGS. 5A and 5B illustrate the waveforms 500 and 520 for the correction current generator 202' of FIG. 3B illustrating the cases when the reference clock 122 leads the feedback clock 124 in FIG. 5A and where the reference clock 122 lags the feedback clock 124 in FIG. 5B. As illustrated, both the reference clock 122 and the feedback clock 124 have the same duty cycle and the PLL circuit 200 is not locked. Once the PLL circuit 200 is locked no correction current Iout 136 would be generated.

Referring now to FIG. 5A where the reference clock 122 leads the feedback clock 124 and the reference clock 122 and the feedback clock 124 have the same duty cycle. The result is Iout 136 sourcing a current during the time when the reference clock 122 leads feedback clock 124 with a magnitude Icp.

Referring now to FIG. 5B where the reference clock 122 lags the feedback clock 124 and the reference clock 122 and the feedback clock 124 have the same duty cycle. The result is Iout 136 sinking a current during the time when the reference clock 122 lags feedback clock 124 with a magnitude Icp.

Referring now to FIG. 6 that shows the waveforms 600 for the correction current generator 202' of FIG. 3B illustrating the case when the reference clock 122 and the feedback clock 124 do not have the same duty cycle and the PLL is frequency-locked. The PLL locks with a phase offset equal to half the difference in pulse widths of the reference clock 122 and the feedback clock 124. There is a periodic sourcing current followed by a sinking current. The narrower pulse ends up centered within the wider pulse when the PLL circuit 200 is locked on frequency. If the feedback clock 124 had the wider pulse then the reference clock 122 would be centered at the center of the corresponding cycle of the feedback clock 124.

Referring now to FIG. 7 that shows the waveforms 700 for the correction current generator 202" of FIG. 3C illustrating the case when the reference clock 122 leads the feedback clock 124 and the PLL circuit 200 is not locked. Once the PLL circuit 200 is locked no correction current Iout 136 would exist. FIG. 7 is substantially equivalent to FIG. 5A as the circuit operation of the correction current generator 202" is substantially analogous to the circuit operation of the correction current generator 202'.

Referring now to FIG. 8 that shows the waveforms for the differential correction current generator 202''' of FIG. 3D illustrating the case when the reference clock 122 leads the feedback clock 124 and the PLL circuit 200 is not locked. Once the PLL circuit is locked no net effective correction current Iout 136' would exist. FIG. 8 is substantially equivalent to the waveform in FIG. 7 as the circuit operation of the correction current generator 202''' is substantially analogous to the circuit operation of the correction current generators 202' and 202". However, the correction current generator 202''' includes additional nodes than the other correction current generators 202' and 202" and therefore additional waveforms are included.

Figure 4A:
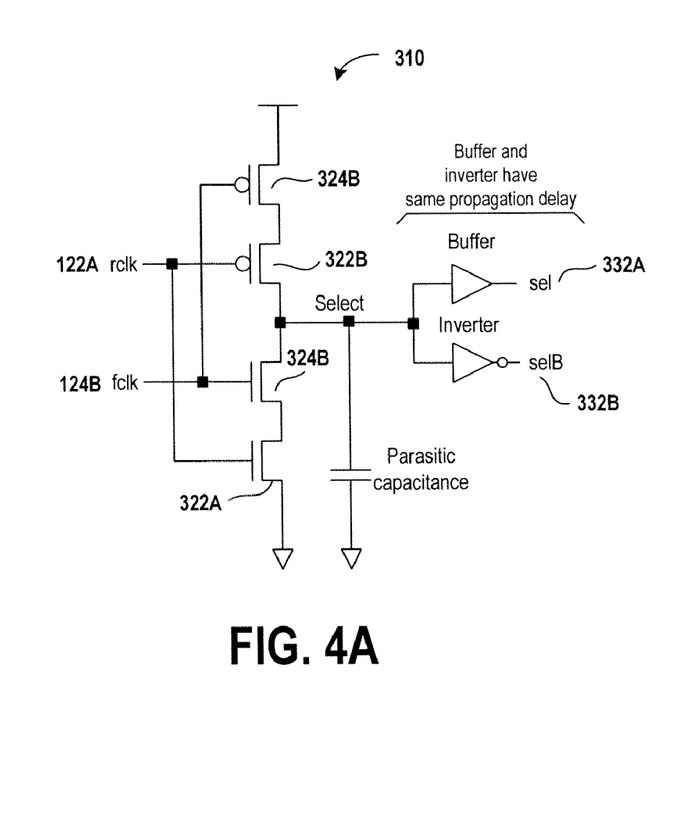
FIG. 4A is a CMOS based implementation of the select circuit of FIG. 3A, in accordance with an embodiment of the present invention.
Figure 4B:
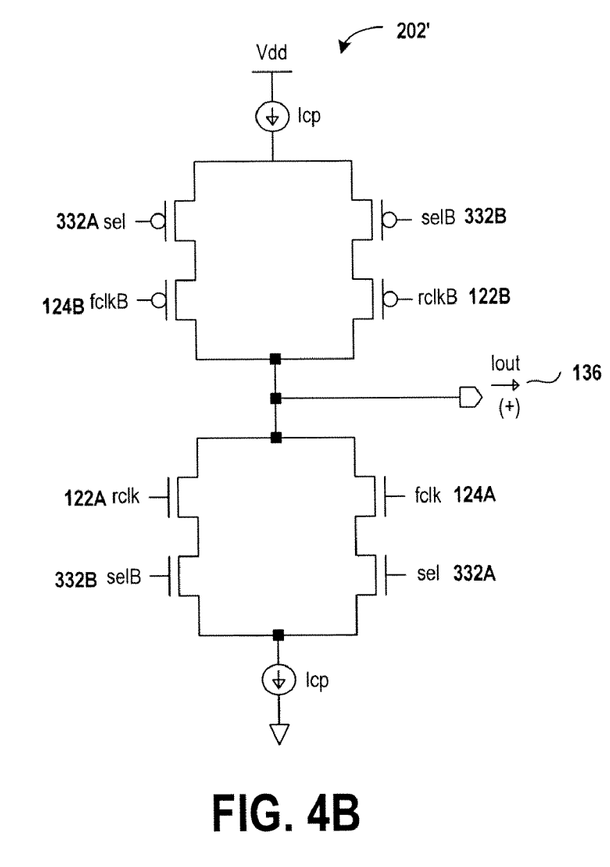
FIGS. 4B-4D are CMOS based implementations of the correction current generators of FIGS. 3B-3D, in accordance with various embodiments of the present invention.
Figure 4C:
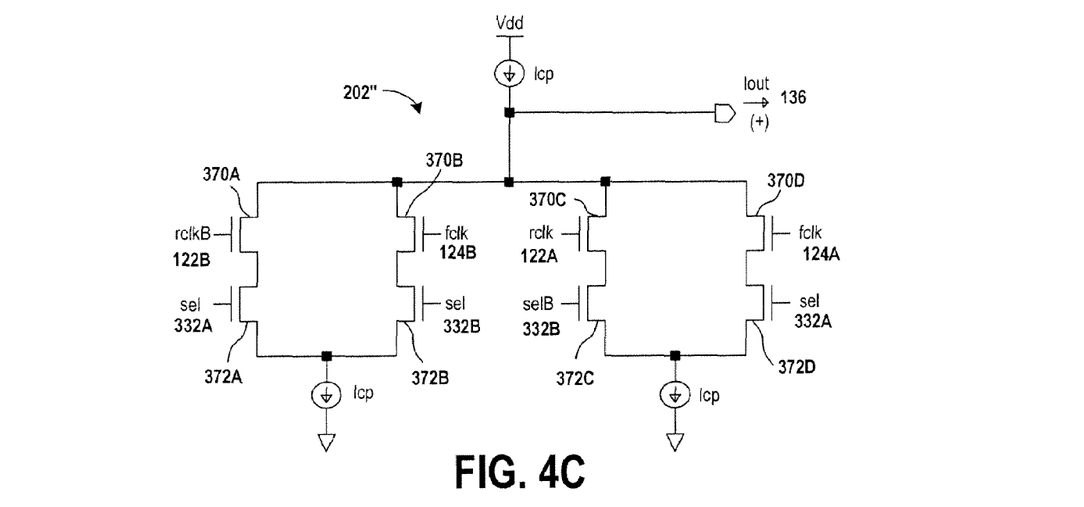
Figure 4D:
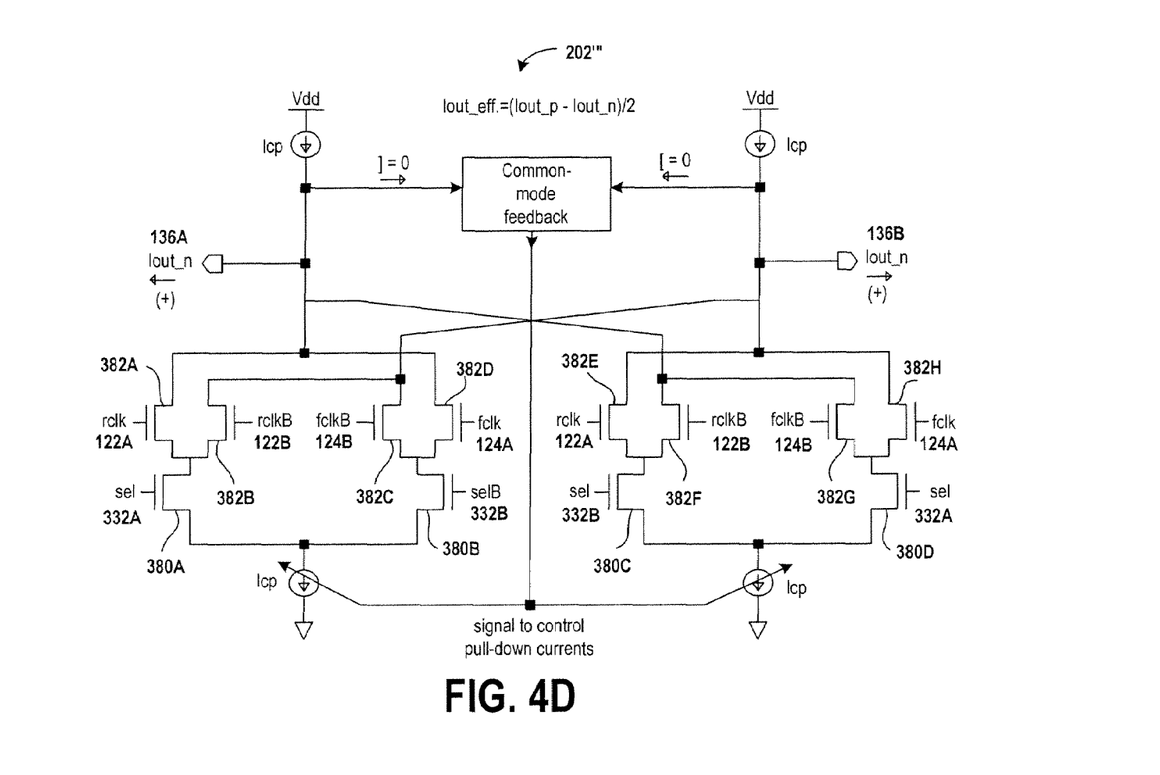

FIGS. 4B-4D are CMOS based implementations of the correction current generators 202', 202" and 202''' of FIGS. 3B-3D, in accordance with various embodiments of the present invention. FIG. 4A is a CMOS based implementation of the select circuit 310 of FIG. 3A, in accordance with an embodiment of the present invention. It should be understood that the various components and the circuit structures shown in each of FIGS. 4A-4D operated substantially similar to the corresponding components and the circuit structures described in FIGS. 3A-3D as described above.

FIGS. 9A-9E illustrate waveforms 910-950 of the average correction current Iout 136, in accordance with various embodiments of the present invention. The average correction current Iout 136 is compared to the phase difference between the reference clock 122 and the feedback clock 124 for any of the correction current generators 202', 202" and 202''' of FIGS. 3B-4D.

Figure 9A:
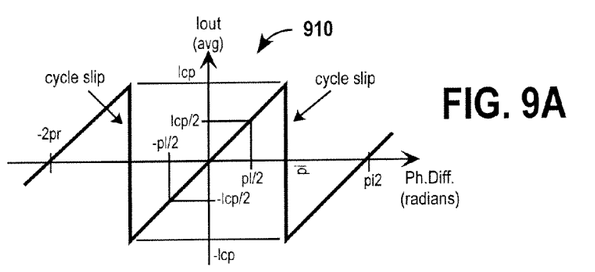
FIGS. 9A-9E illustrate waveforms of the average correction current Iout, in accordance with various embodiments of the present invention.
Figure 9B:
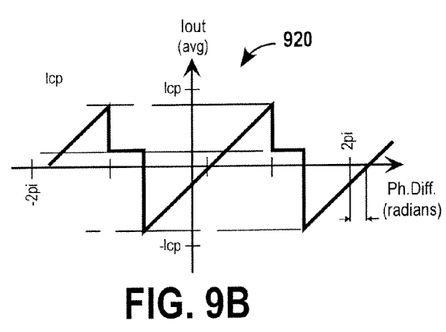

In FIG. 9A, the duty cycle of both the reference clock 122 and the feedback clock 124 are 50% (e.g., duty cycle of the reference clock 122=duty cycle of the feedback clock 124). In FIG. 9B, the sum of the duty cycles of the reference clock 122 and the feedback clock 124 is less than 100% and the duty cycle of the reference clock 122 is greater than the duty cycle of the feedback clock 124.

Figure 9C:
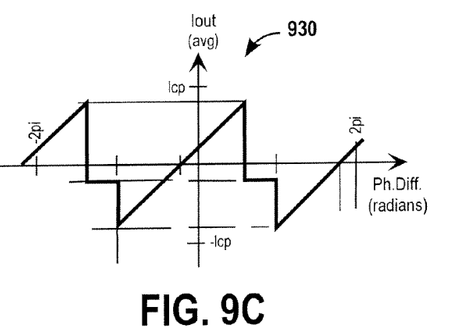
Figure 9D:
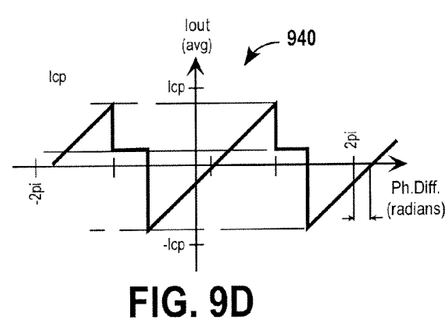
Figure 9E:
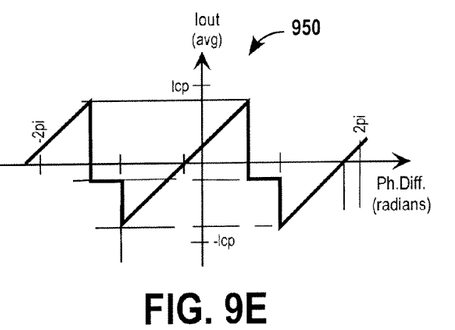

In FIG. 9C the sum of the duty cycles of the reference clock 122 and the feedback clock 124 is less than 100% and the duty cycle of the reference clock 122 is less than the duty cycle of the feedback clock 124. In FIG. 9D, the sum of the duty cycles of the reference clock 122 and the feedback clock 124 is greater than 100% and the duty cycle of the reference clock 122 is greater than the duty cycle of the feedback clock 124. In FIG. 9E, the sum of the duty cycles of the reference clock 122 and the feedback clock 124 is greater than 100% and the duty cycle of the reference clock 122 is less than the duty cycle of the feedback clock 124.

The duty cycle of the feedback clock 124 is when the PLL is locked and the feedback clock 124 has the same frequency as the reference clock 122. The phase difference is the phase difference between the reference clock 122 and the feedback clock 124. dcR=duty cycle (in %) of the reference clock 122=duty cycle (in %) of the feedback clock 124.

In the waveforms 910-950 it is assumed that there is no current leakage at the Iout pin 136. For all cases except FIG. 9A, when the PLL circuit 200 locks there will be a static phase offset (e.g., phase of the reference clock 122 minus phase of the V_clk) equal to pi*(dcR−dcF)/100 which is equal to half the difference between their pulse width. No phase offset is present in the case shown in FIG. 9A.

As shown in FIG. 2 the correction current generator 202 has two inputs (the reference clock 122 and the feedback clock 124) and one output (Iout 136). The waveforms 910-950 of FIG. 9 are obtained as follows:

For a given phase difference (time difference) between the reference clock 122 and the feedback clock 124 (x-axis) measure the average current (per cycle of the reference clock 122 period) and plot it in the y-axis. The waveforms 910-950 represent the average current being sourced (positive number) or sunk (negative number) per a given phase offset.

As illustrated in FIGS. 6 and 9 if the duty cycles of the reference clock 122 and the feedback clock 124 are not equal to each other then a static phase offset between the reference clock 122 and the feedback clock 124 will exist once the PLL circuit 200 reaches a lock state. Assuming no current leakage in the correction current generator 202, the magnitude of such an offset will be equal to half the pulse width difference between the reference clock 122 and the feedback clock 124.

Controlling the duty cycle of the reference clock 122 and the feedback clock 124 is usually not an issue in fully differential circuits where signals with duty cycles of 50% are generated. In frequency multiplication cases phase offsets between reference clock 122 and the feedback clock 124 is not important since only the frequency of the VCO clock matters.

Solution in clock de-skewing application offsets might become an issue but it could easily be avoided by using a toggle flip-flop on each clock to divide their frequency by half before they connect to the correction current generator 202. That would produce clocks with 50% duty cycle thus eliminating the static phase offset. Note that once the frequency division by two is introduced the effective refreshing rate of the correction current generator 202 would become the same as a traditional charge pump 102 and that particular benefit (explained above) will no longer exist.

Figure 10:
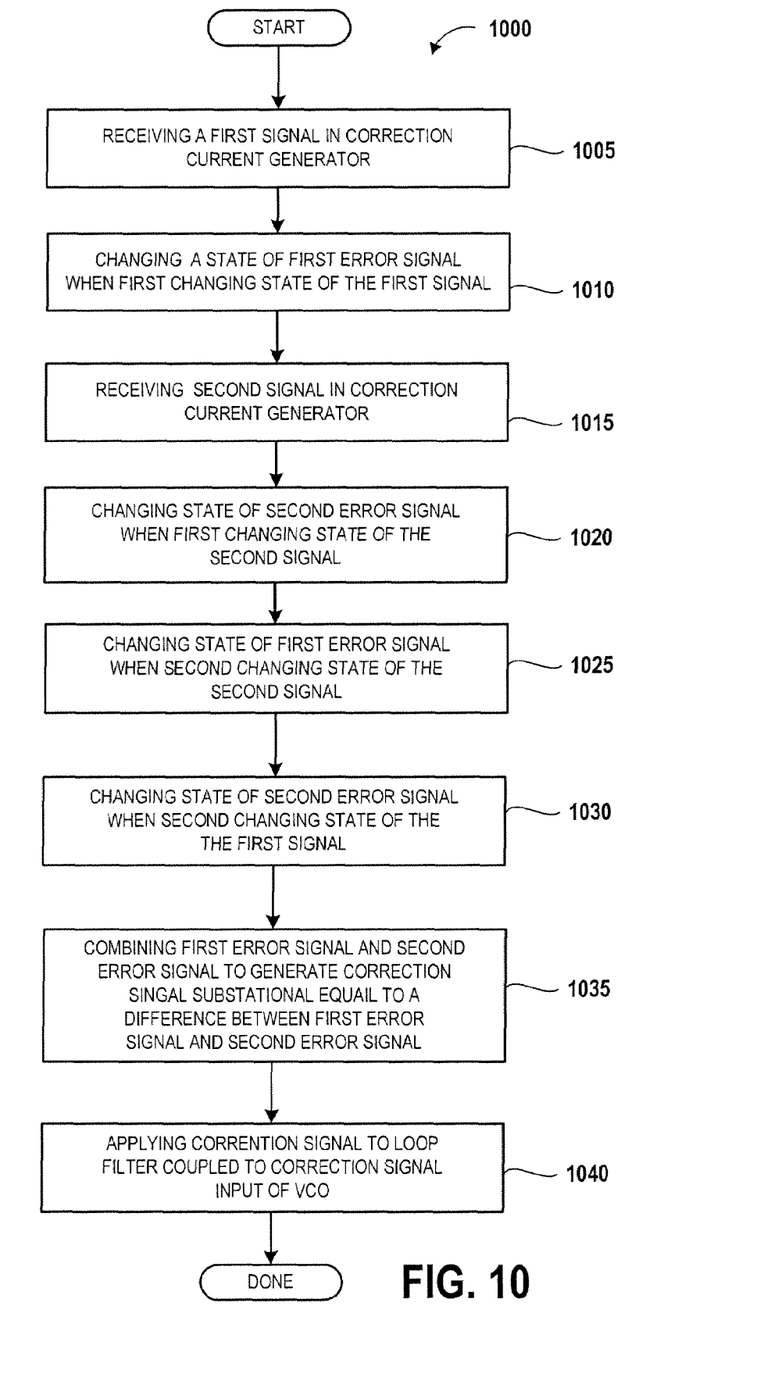
FIG. 10 is a flowchart diagram that illustrates the method operations performed in generating a correction signal, in accordance with one embodiment of the present invention.

FIG. 10 is a flowchart diagram that illustrates the method operations 1000 performed in generating a correction signal, in accordance with one embodiment of the present invention. The correction signal can be used for a voltage controlled oscillator (VCO). In an operation 1005 a first signal in a select circuit and a correction current generator. The first signal will be the first one of either the reference clock 122 or the feedback clock 124.

In an operation 1010, a state of a first error signal is changed substantially simultaneously with a first changing state of the first signal. By way of example if the reference clock 122 leads the feedback clock 124, then when the reference clock 122 changes to a high state, then a pump-up correction current 340 is generated.

In an operation 1015, a second signal is received in the select circuit and the correction current generator. Returning to the above example, if the reference clock 122 leads the feedback clock 124, then the second signal is the feedback clock 124. Although it should be understood that where the feedback clock 124 leads the reference clock 122, the second signal would be the reference clock 122.

In an operation 1020 a state of a second error signal is changed substantially simultaneously with a first changing state of the second signal. Returning to the above example where the reference clock 122 leads the feedback clock 124, then when the feedback clock 124 switches to a high state, then the pump down correction current 342 is generated.

In an operation 1025, the state of the first error signal is changed substantially simultaneously with a second changing state of the second signal. Again with the above example, when the feedback clock 124 switches to a low state, the pump-up correction current 340 is disabled.

In an operation 1030, the state of the second error signal is changed substantially simultaneously with a second changing state of the first signal. Continuing the above example, when the reference clock 122 switches to a low state, the pump down correction current 342 is disabled.

In an operation 1035, the first error signal and the second error signal are combined to generate the correction signal substantially equal to a difference between the first error signal and the second error signal. The pump up correction current 340 and the pump down correction current 342 are combined to produce a correction current 136.

In an operation 1040, the correction signal is applied to a loop filter 106 coupled to a correction signal input of the VCO 108. As described above, the loop filter 106 converts the correction current 136 to a frequency control voltage that can be applied to the VCO 108.

The invention can also be embodied as computer readable code on a computer readable medium. The computer readable medium is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of generating a correction signal for a voltage controlled oscillator (VCO) comprising:
    receiving a first signal in a correction current generator;
    changing a state of a first error signal substantially simultaneously with a first changing state of the first signal;
    receiving a second signal in the correction current generator;
    changing a state of a second error signal substantially simultaneously with a first changing state of the second signal;
    changing the state of the first error signal substantially simultaneously with a second changing state of the second signal;
    changing the state of the second error signal substantially simultaneously with a second changing state of the first signal;
    combining the first error signal and the second error signal to generate the correction signal substantially equal to a difference between the first error signal and the second error signal; and
    applying the correction signal to a loop filter coupled to a correction signal input of the VCO, wherein the correction current generator includes a selector circuit including a buffered select signal equal to an inverse of a product of a buffered first signal and a buffered second signal and an inverted select signal equal to a product of the buffered first signal and the buffered second signal, wherein the correction signal includes a single correction current output including a common mode rejection.

2. The method of claim 1, wherein the first signal is a reference signal and the second signal is a feedback signal output from the VCO.

3. The method of claim 1, wherein the second signal is a reference signal and the first signal is a feedback signal output from the VCO.

4. The method of claim 1, wherein the first signal leads the second signal.

5. The method of claim 1, wherein the first signal and the second signal have a substantially 50% duty cycle.

6. The method of claim 5, further comprising converting the first signal and the second signal to have the substantially 50% duty cycle.

7. The method of claim 1, wherein the correction current generator includes a plurality of current paths.

8. The method of claim 7, wherein changing the state of the first error signal includes selecting a corresponding one of the plurality of current paths in the correction current generator.

9. The method of claim 7, wherein changing the state of the second error signal includes selecting a corresponding one of the plurality of current paths in the correction current generator.

10. A phase locked loop circuit comprising:
    a selector circuit including;
        a reference clock input;
        a feedback clock input; and
        a plurality of select output signals including:
            a buffered reference clock;
            a buffered feedback clock;
            an inverted reference clock;
            an inverted feedback clock;
            a buffered select signal equal an inverse of a product of the buffered reference clock and the buffered feedback clock; and
            an inverted select signal equal to a product of the buffered reference clock and the buffered feedback clock; and
    a correction current generator including:
        a plurality of inputs coupled to the plurality of select outputs; and
        a correction current output, wherein the correction current output includes a single correction current output including a common mode rejection.

11. The PLL circuit of claim 10, further comprising:
    a loop filter including:
        an input coupled to the correction current output of the correction current generator; and
        a loop filter voltage output;

a voltage-controlled oscillator including:
- a frequency control input coupled to the loop filter voltage output; and
- a VCO clock output; and a frequency divider having an input coupled to the VCO clock output and an output coupled to the reference clock input of the selector circuit.

12. The PLL circuit of claim 10, wherein the correction current output is a single correction current output.

13. The PLL circuit of claim 10, wherein the single correction current output including the common mode rejection includes a pair of differential correction current outputs that are combined to form the single correction current output with the common mode rejection.

14. The PLL circuit of claim 10, wherein the correction current generator includes a plurality of current paths, and wherein the plurality of current paths are selectively enabled by a corresponding one of the plurality of select signals.

* * * * *